(12) United States Patent
Kartäusch

(10) Patent No.: US 11,650,278 B2
(45) Date of Patent: May 16, 2023

(54) DEVICE AND METHOD FOR DATA COMPRESSION IN LOCAL COILS

(71) Applicant: Siemens Healthcare GmbH, Erlangen (DE)

(72) Inventor: Ralf Kartäusch, Bubenreuth (DE)

(73) Assignee: Siemens Healthcare GmbH, Erlangen (DE)

( * ) Notice: Subject to any disclaimer, the term of this patent is extended or adjusted under 35 U.S.C. 154(b) by 4 days.

(21) Appl. No.: 17/365,204

(22) Filed: Jul. 1, 2021

(65) Prior Publication Data
US 2022/0011391 A1 Jan. 13, 2022

(30) Foreign Application Priority Data

Jul. 9, 2020 (DE) ...................... 10 2020 208 611.7

(51) Int. Cl.
*G01R 33/56* (2006.01)
*G01R 33/3415* (2006.01)

(52) U.S. Cl.
CPC ..... *G01R 33/5608* (2013.01); *G01R 33/3415* (2013.01)

(58) Field of Classification Search
CPC .................. G01R 33/3415; G01R 33/5608
See application file for complete search history.

(56) References Cited

U.S. PATENT DOCUMENTS

| | | | |
|---|---|---|---|
| 7,141,971 B2 * | 11/2006 | Duensing ........... | G01R 33/3415 324/309 |
| 2010/0013472 A1 | 1/2010 | Buehrer et al. | |
| 2012/0139538 A1 | 6/2012 | Schmidt et al. | |
| 2017/0234948 A1 * | 8/2017 | Huang ............... | G01R 33/5612 324/300 |
| 2019/0293738 A1 * | 9/2019 | Popescu ............ | G01R 33/3664 |

FOREIGN PATENT DOCUMENTS

DE    102010022522 A1    12/2011

OTHER PUBLICATIONS

German Office Action for German Application No. 10 2020 208 611.7 dated May 11, 2021.
Zhang, Tao, et al. "Coil compression for accelerated imaging with Cartesian sampling." Magnetic resonance in medicine 69.2 (2013): 571-582.

* cited by examiner

*Primary Examiner* — Gregory H Curran
(74) *Attorney, Agent, or Firm* — Lempia Summerfield Katz LLC

(57) ABSTRACT

A local coil for an MRI scanner, an MRI scanner and a method for operating the MRI scanner are provided. The local coil includes a plurality of n antenna coils and at least one analog-to-digital converter having a signal link to the antenna coils. The local coil includes a compression device configured to compress the n digital input data streams into m digital output data streams. The n digital input data streams are mapped to an m-dimensional space with m base vectors.

9 Claims, 2 Drawing Sheets

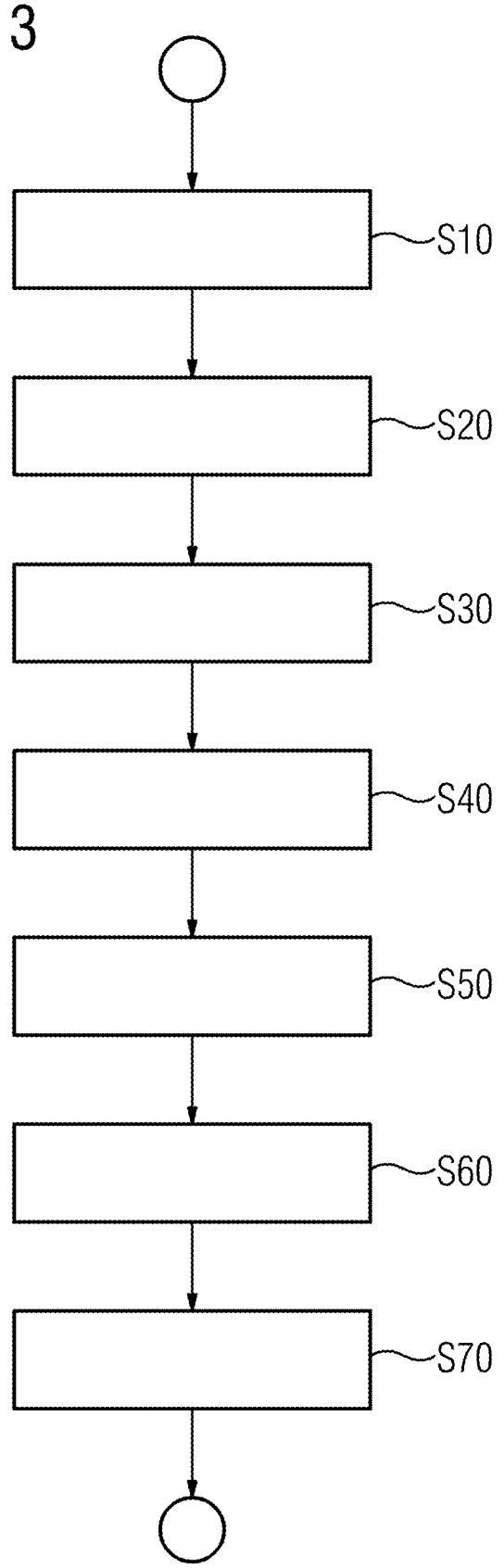

DEVICE AND METHOD FOR DATA COMPRESSION IN LOCAL COILS

CROSS REFERENCE TO RELATED APPLICATIONS

This application claims the benefit of DE 102020208611.7 filed on Jul. 9, 2020, which is hereby incorporated by reference in its entirety.

FIELD

Embodiments relate to a local coil for an MRI scanner including a plurality of antenna coils. One or more analog-to-digital converters include a signal link to the antenna coils and digitize their magnetic resonance signals.

BACKGROUND

MRI scanners are imaging devices that, in order to image an object under examination, align nuclear spins of the object under examination with a strong external magnetic field and excite them to precess around this alignment by an alternating magnetic field. The precession or return of the spins from this excited state to a lower-energy state in turn generates an alternating magnetic field in response, that is received via antennas.

The magnetic gradient fields are used to position-encode the signals that then enables the received signal to be assigned to a volume element. The received signal is then evaluated and a three-dimensional imaging representation of the object under examination is produced. To receive the signal, local receive antennas, e.g., local coils, are used that are disposed directly on the examinee to achieve a better signal-to-noise ratio. The receiving antennas may also be installed in a patient couch.

Until now, the magnetic resonance signals have often only been pre-processed in the local coil using analog devices such as preamplifiers, filters and mixers and then transmitted over radiofrequency lines. Analog signal processing only requires low power and therefore generates little waste heat. However, transmission to the MRI scanner is only reliably possible via RF cables that may transmit a maximum of one or—by frequency division multiplexing—two magnetic resonance signals.

With advances in digital technology, more powerful components with lower energy consumption are available that also allow digitization even in the local coil. Digital technology also allows temporary storage and error protection, so that signals may be transmitted wirelessly to the MRI scanner. At the same time, however, digitization initially increases the required bandwidth, that becomes a problem for example in the case of local coils with an antenna array and a large number of different magnetic resonance signals.

BRIEF SUMMARY AND DESCRIPTION

The scope of the present disclosure is defined solely by the appended claims and is not affected to any degree by the statements within this summary. The present embodiments may obviate one or more of the drawbacks or limitations in the related art.

Embodiments reduce a bandwidth to be transmitted.

The local coil is configured as an MR signal receiving coil for connection to an MRI scanner. A wired or wireless may be used for connection. The local coil includes a plurality of n antenna coils. At least some of the antenna coils include disjoint sensitivity ranges for the magnetic resonance signals. In addition, the local coil includes at least one analog-to-digital converter or ADC having a signal link to the antenna coils, so that the ADC may digitize the magnetic resonance signals of the antenna coils. The ADC may, for example, use multiplexers to sample the plurality of signals consecutively. A separate ADC may be provided for each antenna coil or for an ADC to only digitize a subset of the signals of the antenna coils.

Prior to digitization, amplification by an LNA, filtering and/or frequency conversion by a mixer may also take place.

The local coil additionally includes a compression device that is configured to compress the n digital input data streams into m digital output data streams, where m<n. In this process, the n input data streams are mapped to an m-dimensional space with m base vectors. The cumulative data rate of all m digital output data streams is lower than the cumulative data rate of the n input data streams. In an embodiment, the data rate of the individual digital output data streams and of the individual input data streams is the same.

The compression may be regarded as mapping of the n-dimensional input data to m-dimensional output data, wherein the output data corresponds to the coordinates in respect of the m base vectors. The m base vectors may be defined by geometric properties of the individual antenna coils such as sensitivity ranges, but also by other properties such as the emission properties of the nuclear spins. One possible embodiment may be represented as m virtual antennas whose sensitivity ranges are essentially disjoint, each detecting a different volume. This eliminates unnecessary redundancy in the signals and allows the overall data rate to be reduced without losing energy or signal-to-noise ratio (SNR). The signals of the m virtual antennas are generated by mapping the n digital input data streams to the m digital output data streams. Because of the disjoint sensitivity ranges of the virtual antenna signals, the base vectors are orthogonal, as a change in a first of the m digital output data streams does not impose a change in a second of the m digital output data streams. The mapping in the compression device may be program-controlled by a signal processor or also by programmable or hard-wired logic.

The mapping from n input data streams to m digital output data streams may be essentially lossless, for example because of redundancy or rather symmetry properties of the digital input signals, information and/or energy density is only lost due to numerical errors during the mapping to the m digital output data streams.

By the compression device, the local coil achieves a reduced transmission bandwidth without degrading the image quality to be achieved.

The method is configured to operate an MRI scanner using a local coil. The MRI scanner includes a controller, the local coil including a plurality of n antenna coils, an analog-to-digital converter (ADC), and a compression device.

In a step of the method, the local coil receives n magnetic resonance signals by the n antenna coils. The receiving may also include analog pre-processing such as impedance matching using matching elements, pre-amplification by an LNA and/or filtering by a high-pass, low-pass or band-pass filter.

The n magnetic resonance signals are then digitized into n digital input data streams by an ADC in time division multiplex using an upstream multiplexer. Alternatively, n ADCs may perform the conversion digitally in parallel or a number of p ADCs where n>p>1 may each digitize some of the magnetic resonance signals in multiplex.

In a further step of the method, the compression device maps n digital input data streams to m digital output data streams, where n>m, and the n input signals are mapped to an m-dimensional space with m base vectors. The data rate of the m digital output data streams is lower than the data rate of the n digital input data streams, so that the volume of data is compressed. In an embodiment, the data rates for each digital input data stream and digital output data stream are the same.

The base vectors may be orthogonal to one another, so that the m digital output data streams are essentially independent of one another and have no redundancy. For example, the m digital output data streams might correspond to the signals of virtual antenna coils that together completely cover an examination volume but include disjoint sensitivity ranges. However, other properties of the n digital input data streams, such as time or spectral properties, that result in mapping to m base vectors, are also possible.

In a further step, a reconstruction or control computer generates a magnetic resonance image from the m output data streams. With regard to image reconstruction, the m digital output data streams may be similar in their properties to the input data streams in which a magnetic resonance image may be generated using image reconstruction algorithms identical to those for the digital input data streams, e.g., if the m output data streams correspond to magnetic resonance signals from m virtual antenna coils as described above and the compression is transparent for image reconstruction in this respect. However, it is also conceivable for the reconstruction computer to apply an adapted algorithm for reconstruction from the m digital output data streams.

In a further step, the magnetic resonance image is displayed to a user on a display device or stored on a data storage device for further processing.

The method shares the advantages of the local coil. In an embodiment it is also transparent for subsequent reconstruction steps.

In an embodiment of the local coil, the compression device includes a control input for a signal link to a control unit. This is to be understood as including any interface, whether wireless or wired, via which the compression device may receive the data described below.

The compression device is configured to receive from a control unit, via the control input, a mapping matrix for mapping the n input values of the input data streams to m output values of the m output data streams. In other words, the compression device is equipped with the appropriate hardware and/or software to receive the mapping matrix via this control input and to make it effective for the compression or more specifically the described mapping of the input data streams to the output data streams.

The control input makes it possible to adapt the mapping matrix to changed states, e.g., to different numbers of data streams. At the same time, the control input provides complex and power-consuming operations for determining the base vectors and mapping matrix to be transferred to external, more powerful hardware.

In an embodiment of the local coil, the compression device is configured to determine a mapping matrix as a function of the n digital input data streams. For example, the compression device may incorporate a processor and program storage to perform one of the methods described below for determining the base vectors.

The ability to determine the mapping matrix enables the local coil to adapt to changing operational conditions. Also, the use of the local coil may be transparent to the MRI scanner without modification thereto.

In an embodiment of the local coil, the compression device is configured to perform lossy compression. In this context, lossy compression is considered to be compression in which information and/or energy of the original input data streams is reduced to a minimum or lost.

Lossy compression makes it possible to reduce the data rate more greatly or to simplify the determining of the compression parameters or matrix.

In an embodiment of the local coil, the compression device is configured to perform singular value decomposition on a number t of data points of the n digital input data streams of the n antenna coils. The singular value decomposition allows the n input data streams used to be reduced to a smaller number m. The data is thus projected onto a smaller matrix, thereby performing compression.

Compression by singular value decomposition uses properties of the input signals to compress them with as little loss as possible or without any loss at all.

The advantage of compression along the dimensions of the antennas is that downstream hardware and software need little or no adjustment. The compression is transparent.

In an embodiment of the method, the method includes the step of using an MRI scan to acquire a sensitivity map. In this context, a sensitivity map is considered to be a map that assigns to each volume element a value that is a measure of the strength of a magnetic resonance signal caused by nuclear spins in the volume element in the respective antenna coil. This may be done, for example, by exciting nuclear spins in a homogeneous phantom and measuring the magnetic resonance signals generated.

In a further step, the controller determines singular values and a mapping matrix that are then transmitted to the compression device via the control input. By the matrix, the compression device is then able to map n input data streams into the space of the m output data streams spanned by the m base vectors. The external calculation of the singular value decomposition reduces the hardware requirements for the compression device.

BRIEF DESCRIPTION OF THE FIGURES

FIG. 3 depicts a schematic representation of a flow chart of a method according to an embodiment.

DETAILED DESCRIPTION

Figure 1:
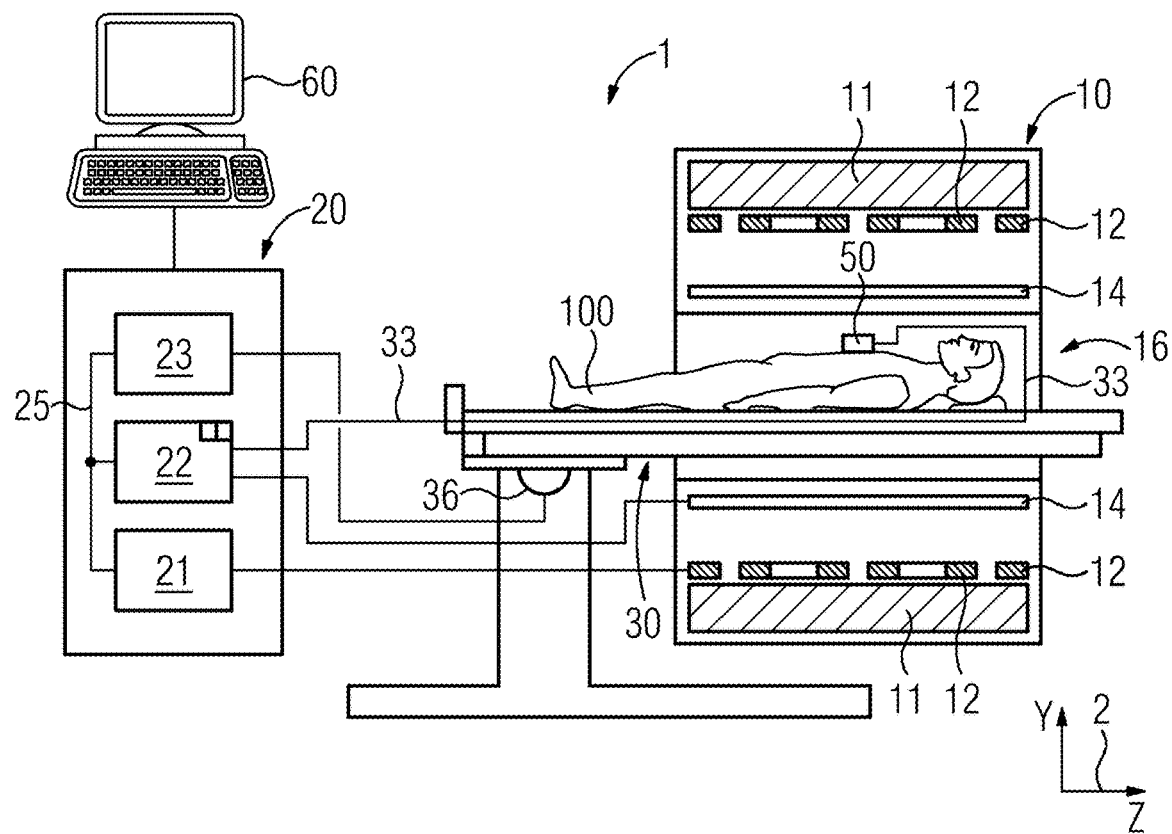
FIG. 1 depicts a schematic representation of an MRI scanner.

FIG. 1 depicts a schematic representation of an embodiment of an MRI scanner 1.

The magnet unit 10 includes a field magnet 11 that generates a static magnetic field B0 for aligning nuclear spins of samples or more specifically of the patient 100 in an accommodation area. The accommodation area is characterized by a static magnetic field B0 that is extremely homogeneous in respect of the magnetic field strength or rather the absolute value thereof. The accommodation area is almost spherical and is disposed in a patient tunnel 16 that extends through the magnet unit 10 in a longitudinal direction 2. A patient couch 30 may be moved within the patient tunnel 16 by the positioning unit 36. The field magnet 11 is typically a superconducting magnet that may provide magnetic fields with a magnetic flux density of up to 3 T, or even higher in the case of the latest devices. However, for lower field strengths, permanent magnets or electromagnets having normally conducting coils may also be used.

The magnet unit 10 also includes gradient coils 12 that are configured to superimpose variable magnetic fields in three spatial directions on the magnetic field B0 in order to spatially differentiate the detected imaging regions in the examination volume. The gradient coils 12 are typically coils of normally conducting wires that may generate mutually orthogonal fields in the examination volume.

The magnet unit 10 also includes a body coil 14 configured to radiate a radiofrequency signal, supplied via a signal line, into the examination volume and to receive resonance signals emitted by the patient 100 and feed them out via a signal line.

A control unit 20 supplies the magnet unit 10 with the various signals for the gradient coils 12 and the body coil 14 and evaluates the received signals.

The control unit 20 includes a gradient driver 21 that is configured to supply the gradient coils 12 with variable currents via feed lines to provide the desired gradient fields in the examination volume in a time-coordinated manner.

In addition, the control unit 20 includes a radiofrequency unit 22 that is configured to generate an RF pulse with a predetermined timing, amplitude and spectral power distribution for exciting a magnetic resonance of the nuclear spins in the patient 100. Pulse powers in the kilowatt range may be achieved. The excitation pulses may be radiated into the patient 100 via the body coil 14 or via a local transmit antenna.

A controller 23 communicates with the gradient driver 21 and the radiofrequency unit 22 via a signal bus 25.

The controller 23 is in contact, via a signal link, with a user interface 60 via which the MRI scanner and noise suppression controller 84 receive information about a physical characteristic of the patient 100. This may be an operator terminal in the control room of the MRI scanner via which an operator directly enters details about a physical characteristic of the patient 100. However, a hospital information system may also be used in which patient data is stored and/or the examinations are prepared or coordinated. The user interface may be local or connected via a wide area network.

A local coil 50 is placed on the patient 100, the local coil 50 being either connected to the radiofrequency unit 22 and its receiver via a connecting cable 33 as shown, but may transmit the received magnetic resonance signals wirelessly to the MRI scanner 1.

Figure 2:
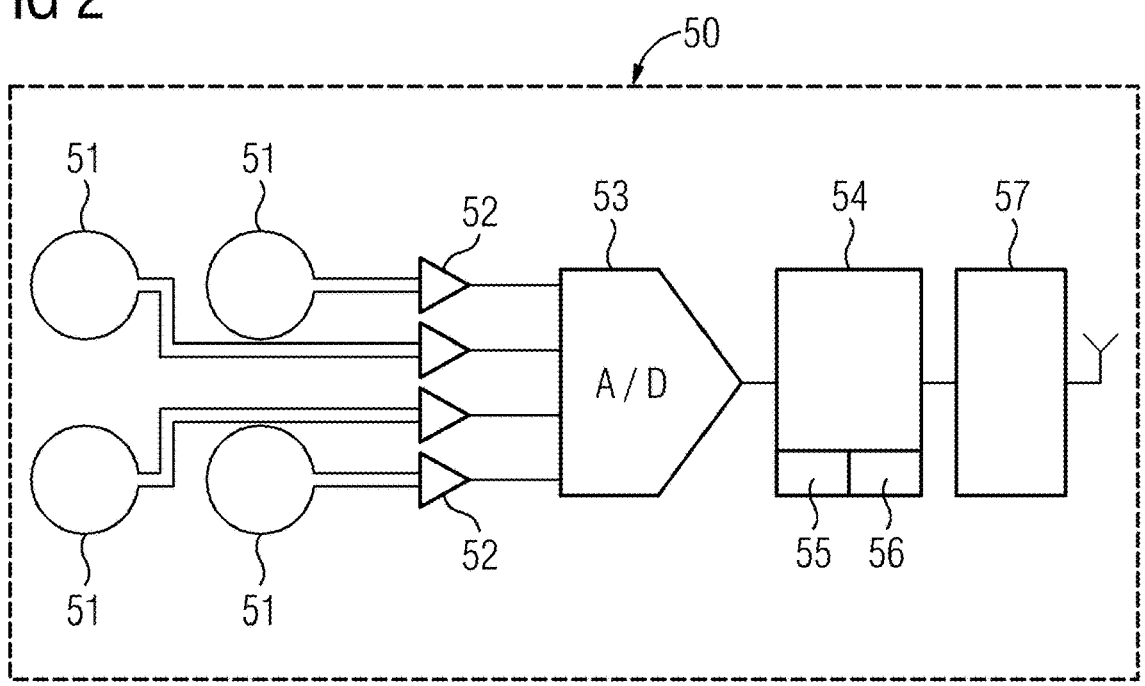
FIG. 2 depicts a schematic representation of a local coil according to an embodiment.

FIG. 2 depicts a schematic representation of a local coil 50 according to an embodiment. The local coil includes a plurality of antenna coils 51, four antenna coils 51 being shown here by way of example. The magnetic resonance signals induced in the antenna coils 51 from the patient 100 are first amplified by low-noise preamplifiers LNA 52. Any intervening matching network is not shown for the sake of clarity, nor are circuits for detuning the antenna coil 51 or for decoupling.

The magnetic resonance signals of the individual antenna coils 51 are then digitized. This may be performed by dedicated analog-to-digital converters ADC 53 in parallel, or by a single ADC 53 with upstream multiplex and sample-and-hold elements. However, with a large number of antenna coils 51, their signals may be first combined in an analog manner, e.g., in pairs. In this way, n (n=4 in the example in FIG. 2) data streams are provided at the output of the ADC 53.

Next, the n data streams are compressed to a smaller number of m data streams by the compression device 54.

The compression device 54 is configured to map the n input data streams to the m output data streams by singular value decomposition and projection, so that the energy of the original n input data streams is retained.

By way of illustration, the compression device 54 may be viewed as a matrix operator that initially includes n inputs and n outputs, i.e., is a square matrix. The aim is to find matrix coefficients that do not yield energy on a number of n-m output signal currents, or yield output signals close to zero, but concentrate this energy on the m output signals. If the input signal currents were completely independent, this would not be possible without loss of information or energy. However, because of overlapping sensitivity ranges and also similarity of the signals in time, the n input data streams have redundancy or rather dependencies that allow the reduction. Here, the n input data streams are mapped to m output data streams that constitute coordinates in an m-dimensional space spanned by eigenvectors of the matrix and that are essentially, i.e., in the context of the numerical solutions, orthogonal or rather independent of one another. Ideally, the m output data streams represent signals from m virtual antenna coils that generate completely independent and redundancy-free MR signals, e.g., because the sensitivity ranges are disjoint. However, the number m may also be chosen larger than in this ideal case, so that the signals are not independent of one another or particular output data streams are almost constantly zero if the compression factor may be lower.

The eigenvectors and the mapping matrix may be determined, for example, by the well-known singular value decomposition. However, this is time-consuming to calculate. Therefore, there is a division of labor between the signal processing resource in the compression device 54, e.g., a signal processor or FPGA, and the controller 23 of the MRI scanner 1. The reception characteristics between the antenna coils 51 of a local coil 50 barely change during image acquisition. For the mapping matrix, it is therefore sufficient if, at the start of image acquisition, the complex determining of the mapping matrix is carried out in the controller 23, e.g., by singular value decomposition, and the mapping matrix is then transferred to the storage device 55 of the compression device 54, as explained below for the method according to FIG. 3.

The compression by matrix multiplication with the constant mapping matrix then requires comparatively low computing power and may be performed e.g., using an energy-saving FPGA or signal processor as the computing unit 56 of the compression device 54.

The mapping matrix may be determined by singular value decomposition in a more powerful computing unit 56 of the local coil 50, so that the method is transparent to the MRI scanner.

FIG. 3 depicts a flow chart of an embodiment of the method according to an embodiment.

In a step S30, the local coil 50 receives n magnetic resonance signals by the n antenna coils 51. The receiving may also include the analog processing of the magnetic resonance signals by a matching network and/or a preamplifier. Signals from an even larger number of antenna coils may be initially combined in an analog manner, e.g., pair-wise from 2*n antenna coils in each case.

In a step S40, the local coil 50 digitizes the received magnetic resonance signals by the analog-to-digital converter 53 and thus generates n digital input data streams for the n magnetic resonance signals of the n antenna coils 51.

In a step S50, the compression device 54 compresses the n digital input data streams to m digital output data streams.

Here, n>m and the n input data streams are mapped to an m-dimensional space with m base vectors. The compression may be performed e.g., by multiplying an input vector from the n input data streams by an n×m mapping matrix, where n may be greater than m*2, m*4 or m*8. The compression is virtually lossless, i.e., the energy of the input data streams or rather the signal-to-noise ratio SNR thereof remains unchanged.

In step S60, the controller 23 or another dedicated image reconstruction computer reconstructs a magnetic resonance image from the m output data streams. The reconstruction may be performed transparently, i.e., the reconstruction algorithm sees the m output data streams as virtual antenna signals and may obtain a magnetic resonance image from them without modification.

In a step S70, the magnetic resonance image is output on a display device, e.g., the operator terminal 60.

In an embodiment of the method, the compression step S40 includes a singular value decomposition (SVD). The compression is achieved by a matrix P with the dimensions M×N. During compression, the M data points acquired in parallel by the M coil channels are combined so that these N data points correspond to N virtual coils. The advantage here is a combination in which as little signal intensity as possible is lost. This combination may be determined using the SVD. If the compression is to be carried out e.g., slice by slice, the matrix S=(m,x,y) is used, where x,y are k-space points in the x and y direction and m the individual coil channels. The SVD provides a projection matrix P to be determined. Taking $S=U\Sigma V^H$ with U of a unitary M×M matrix, $V^H$ the adjoint of a unitary N×N matrix V and Σ a real M×N matrix, where the first half of the diagonal values of correspond to the singular values of the matrix M and the remainder are 0. If U is truncated after the first N singular values, the projection matrix $P=U^H_{(1-N)}$ is obtained. This as well as further optimization of the compression matrix by e.g., an alignment is described in "Coil compression for accelerated imaging with Cartesian sampling; Tao Zhang John M. Pauly Shreyas S. Vasanawala Michael Lustig; Magnetic Resonance in Medicine 69:571-582 (2013)".

In an embodiment of the method, the method includes the step S10 of acquiring a sensitivity map using a magnetic resonance scan and, in a step S20, determining singular values therefrom using the controller and transmitting them as base vectors to the compression device. The compression may therefore be carried out without further calculation of the singular value decomposition in the compression device.

The properties of the local coil 50 and its antenna coils 51 may be initially detected in step S10 by individual test signals of the MRI scanner 1, e.g., by separately detecting the properties of the antenna coils 51 by coefficients equal to 1 on the diagonal. Since only m<n signals may be transmitted simultaneously, this may also be done by repetition using changed coefficients in order to initially detect the input signal currents 1 to m, then m+1 to 2*m and so on.

Using the output matrix determined in this way and the associated output signals, the eigenvectors are determined in step S20 and a mapping matrix that maps n input data streams to m output data streams is determined. The m eigenvectors whose eigenvalues are as large as possible may be selected as the basis for the m output data streams. In an embodiment, the mapping matrix is determined in a processor of the controller 23 of the MRI scanner or in another computing unit of the MRI scanner. The MRI scanner 1 then transmits the mapping matrix via a signal link, e.g., the signal line 33 or a wireless signal link, to a storage device 55 of the compression device 54, so that the computing unit 56 of the compression device 54 may perform the mapping of the n input data streams by vector multiplication of an input vector from the n input data streams by the mapping matrix. The matrix multiplication with a constant matrix requires comparatively little computing power and may be performed, for example, by an energy-saving FPGA or signal processor.

The mapping matrix may be determined by singular value decomposition in a more powerful computing unit 56 of the local coil 50, so that the method is carried out transparently for the MRI scanner 1.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present disclosure has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A local coil for an MRI scanner, the local coil comprising:
   a plurality of N antenna coils;
   at least one analog-to-digital converter comprising a signal link to the plurality of N antenna coils; and
   a compression device configured to perform compression of N digital input data streams to M digital output data streams where M<N, wherein the N digital input data streams are mapped to an M-dimensional space having M base vectors, wherein the compression device comprises a control input for a signal link to a control unit, wherein the compression device is configured to obtain from the control unit, via the control input, a mapping matrix for mapping the N digital input data streams to the M digital output data streams.

2. The local coil of claim 1, wherein the compression device is configured to determine a mapping matrix as a function of the N digital input data streams.

3. The local coil of claim 1, wherein the compression is a lossy compression.

4. The local coil of claim 1, wherein the compression device is configured to perform a singular value decomposition of the N digital input data streams of the N antenna coils and to project the N digital input data streams onto the M digital output data streams.

5. The local coil of claim 1, wherein a number of data points of individual N digital input data streams and M digital output data streams remain unchanged.

6. A method of operating an MRI scanner, wherein the MRI scanner comprises a controller, a local coil comprising a plurality of N antenna coils, an analog-to-digital converter, and a compression device, the method comprising:
   receiving N magnetic resonance signals by the plurality of N antenna coils;

digitizing the N magnetic resonance signals by the analog-to-digital converter to produce N digital input data streams;

receiving, via a control input, a mapping matrix for mapping the N digital input data streams to M digital output data streams;

compressing the N digital input data streams to the M digital output data streams using the mapping matrix where N>M and wherein N input signals are mapped to an M-dimensional space with M base vectors;

reconstructing a magnetic resonance image from the M digital output data streams; and displaying the magnetic resonance image on a display device.

7. The method of claim 6, wherein compressing is performed using a singular value decomposition of the N digital input data streams.

8. The method of claim 7, further comprising:
acquiring a sensitivity map using an MRI scan;
determining singular values therefrom using the controller; and
transmitting the singular values as base vectors to the compression device.

9. The method of claim 6, wherein the compression is a lossy compression.

* * * * *